United States Patent [19]
Eul et al.

[11] Patent Number: 5,097,215
[45] Date of Patent: Mar. 17, 1992

[54] METHODS FOR ESTABLISHING THE COMPLEX MEASURING CAPACITY OF HOMODYNE NETWORK ANALYZERS

[75] Inventors: Hermann-Josef Eul, Essen; Burkhard Schiek, Bochum, both of Fed. Rep. of Germany

[73] Assignee: Laboratorium Prof. Dr. Rudolf Berthold GmbH & Co., Wildbad, Fed. Rep. of Germany

[21] Appl. No.: 506,131

[22] Filed: Apr. 9, 1990

[30] Foreign Application Priority Data

Apr. 7, 1989 [DE] Fed. Rep. of Germany ....... 3911254

[51] Int. Cl.$^5$ ........................................... G01R 27/04
[52] U.S. Cl. .................................. 324/601; 324/638; 324/642
[58] Field of Search ............... 324/601, 637, 638, 639, 324/642

[56] References Cited
U.S. PATENT DOCUMENTS 4,904,927  2/1990  Garbe et al. .................... 324/642
4,982,164  1/1991  Schiek et al. ................. 324/601 X Primary Examiner—Kenneth A. Wieder
Assistant Examiner—Glenn W. Brown
Attorney, Agent, or Firm—Spensley, Horn, Jubas & Lubitz

[57] ABSTRACT

Methods for establishing the complex measuring capability of homodyne operating network analyzers. Single port as well as two-port measuring devices are treated in which the signal detection takes place by means of a linear mixing process. It is possible to overcome the disadvantage of the homodyne detection process, which does not directly supply information relating to the amplitude and phase of the measurement signal, by measuring arbitrary unknown standards. The required number of different unknown standards depends, among other things, on the complexity of the measuring device used. One of the proposed methods operates without any standards at all. After weighting factors have been determined, complex measuring values can be ascertained and one can then proceed as in the case of a heterodyne network analyzer, i.e. with system error calibration measurements and finally with DUT (device under test) measurements.

13 Claims, 10 Drawing Sheets

METHODS FOR ESTABLISHING THE COMPLEX MEASURING CAPACITY OF HOMODYNE NETWORK ANALYZERS

BACKGROUND OF THE INVENTION

The present invention relates to establishment of the complex measuring capacity of measuring apparatus with mixer detection.

In ac signal processing systems, it is often necessary to determine quantities to be measured, for example currents or voltages, as to their magnitude and phase. The ability to test signals as to their magnitude and phase is called complex measuring capacity or vectorial measuring capacity.

It is usually necessary to measure such values in order to determine accurately the properties of electrical circuits. Devices intended for measuring these parameters are called network analyzers. They can be assigned to two groups, namely scalar and vectorial network analyzers, depending on whether the values of interest, i.e., the network parameters, are to be determined as to their frequency only or as to their magnitude and phase.

With higher frequencies, it becomes increasingly more difficult to determine the respective parameters of the signals. As a rule, the signal to be measured is transformed into lower frequency oscillations by a heterodyne mixing process. The lower frequency oscillations are proportional in amplitude and phase to the high frequency signal, i.e., they contain all of the information of interest.

Since such apparatus operating on the basis of the heterodyne principle entails considerable costs, less costly apparatus operating on the homodyne principle is substituted for it whenever possible. Such apparatus operates with a single standard signal generator and is very sturdy. However, a disadvantage of this detection process is that it only provides real information. In general, two operations are common. First, measurement of amplitude, which is performed by means of, for example, detector diodes or output meters. [4][12] Secondly, detection by means of mixers, which provide information proportional to the real part of the complex signal to be measured. [1] In the case of scalar-network analyzers it is customary to work only with the information regarding the frequency of the test signals. This apparatus will not be further discussed here.

The disadvantage of test signals with real values is that they must be compensated for in order to provide vectorial network analyzers. For this purpose, interference principles, in which two different signals are superposed in a different manner, are often used in the detection of amplitudes. With a sufficient number of superpositions it then is possible to provide conclusions as to the ratio of the two signals or of a value proportional thereto. In contrast to this, in connection with mixer detection the signal to be tested is measured once in a direct manner and then in a phase-shifted manner.

FIGS. 1-4 illustrate the detection part of homodyne systems. The system shown in each of these figures can be employed, in subsequent figures, as a device which will be identified as a KHD.

The device in accordance with FIG. 1 is used to explain the detecting process. The amplitudes of the signal a to be measured and present at the mixer 1 and of the local oscillator signal b are selected in such a way that the mixer operates linearly, i.e., $$|a| << |b|.$$

In the steady state of signal a, the mixer output dc voltage U, filtered out by the low pass filter 2, is $$U = Re\left(\eta \frac{ab^*}{|b|}\right) = \eta Re\{ae^{-j\phi b}\}, \text{ with } b = |b|e^{j\phi b}, \quad (1)$$

where $\eta$ is the real mixer conversion efficiency. By means of a suitable choice of the planes of reference it is always possible to make $$U = \eta RE\ a \quad (2)$$

Furthermore, it is possible to assume the mixer conversion efficiency to be 1 ($\eta=1$), because it can be mentally transposed into the calibrating values, which are also not known and need to be determined by appropriate measurements.

The fact that the complex measuring capability is unknown—U in Eq. (2) is only a real value—can be remedied in a number of ways. In this connection, a few explanatory initial considerations with reference FIG. 2 follow. In FIG. 2, the signal a to be detected is split into two portions in the signal splitter 3, where $$a_1 = a,\ a_2 = k\ a \quad (3)$$

applies. In a manner analogous to Eq. (2), the dc voltages filtered out by the low-pass filters 5 and 6 then are $$U_1 = Re\ a,\ U_2 = Re(ka) \quad (4)$$

It is easy to show by insertion that by means of $$U(p) = U_1 + p\ U_2 \quad (5)$$

a fictitious value is formed which is proportional to a and thus has a complex value, if $$p = -\frac{1}{k^*} \quad (6)$$

applies. Here, k is the effective phase displacement generated by the phase shifter 7. A particularly advantageous case is $k = e^{-j90°}$, so that $p=j$ and $U(p) = U_1 + jU_2$. But also the general case, that $|k| \neq 1$ and $arc(k) \neq \pm 90°$, are included with Eqs. (5) and (6), in which case Im $k \neq 0$ is required.

A problem arises from the fact that the characteristic of the phase shifter is generally not known a priori, so that the effective characteristic of the phase shifter or, because of Eq. (6), similarly the complex weighting factor p must be determined in an appropriate manner by measuring. The procedure of assuming an approximate value for k while accepting possible errors is common. Such an approximate value can be provided by external measurements performed on the phase shifter. This is an approximate value for the reason that because of the coupling of the phase shifter with its wiring—for example resulting in multiple reflections—a different phase shift value becomes effective in connection with the actual test set-up than with the external measuring apparatus. It is therefore necessary to determine the effective characteristic k of the phase shifter in situ. In accordance with the state of the art this can be accomplished if, for example, additional phase shifts are generated by the addition of unknown binary phase shifters, so that sufficient measured values are available to determine the value k of interest or also, simultaneously, p.

[9] The methods according to the present invention are distinguished by broader applicability, a smaller number of additionally required components, clearly reduced demands on the latter and clearly reduced demands regarding their combination. Furthermore, the methods are not limited to a complex voltmeter, but relate to complete network analyzers which mostly have several measurement points. In accordance with the use of the method, complex measurability is then established simultaneously at all measurement points.

To explain these methods, the device will first be more generalized, for which purpose the nodes 3 and 4 of the local oscillator output distribution and the phase shifter 7 in FIG. 2 will be considered in more detail. The functions of node 3 and phase shifter 7 can often be taken over by a component 8 which, in the high frequency range, can be, for example, a coupler. It should be noted that it is also permissible to interchange parts 8 and 4, which does not, however, result in basic differences, so that hereafter only one variation will be described.

In whichever way the combination is selected, it is possible to form a complex replacement measuring value U(p) analogous to Eq. (5), which is proportional in amplitude and phase to the actual measuring value a, $$a \sim U_1 + p\, U_2 = U(p), \tag{7}$$

where a possibly present proportionality factor is treated as already described. The weighting factor p is, as already mentioned, not known a priori, so that the replacement measuring value U(p), which thus can only be formed formally, must always be noted in relation to this weighting factor.

In a variation of the previous wiring it is possible to use, instead of the signal splitting at 8 and detection with the mixers 9 and 10, a detection point which does not operate temporally parallel but serially.

In this connection consider the device shown in FIG. 3. The signal a to be detected—or here again the local oscillator signal b—is fed to a mixer 12 via a switchable binary phase shifter (BPS) 11, which can assume either one of two states in a reproducible manner. In this instance phase shifter 11 has the transmission factor $c_o$ in the first state and $kc_o$ in the second. Here, too, $|k| \neq 1$ is permissible, which can be caused, for example, by a parasitic amplitude modulation of the binary phase shifter. However, coupling of the binary phase shifter with other time-variable elements of the measuring apparatus is not permissible, which constitutes a certain disadvantage of this variation.

The low-pass filtered mixer output voltage in the first state of the phase shifter is $U_1$ and, after switching, in the second is $U_2$. Here again, $$a \sim U_1 + p\, U_2 = U(p), \text{ with } p = -\frac{1}{k^*} \tag{8}$$

applies.

Besides the cases mentioned so far, the mathematical representation used can also be applied for basically different devices, so that they can be adapted to the concept of the invention. In this connection, reference is made to FIG. 4, in which either the signal a to be detected or the local oscillator signal b is fed to mixer Eq. (14), shifted by the frequency $f_{ZF}$ by means of a single sideband offset device (ESB). The output signal of mixer 14 is filtered by a band pass filter 15 with the center frequency $f_{ZF}$, so that then an intermediate frequency signal is available, which ideally—as in a heterodyne mixing process—is proportional in amplitude and phase to the signal to be detected. The complex voltage measured is designated with $U_{ZF}$, for which $$U_{ZF} \sim a \tag{9}$$

applies but which, in the actual case, is disturbed because of the now finally satisfactory suppression of the reflecting band. This is expressed by there being an interference term proportional to the conjugated complex signal $$U_{ZF} \sim a + s_e\, a^* \tag{10}$$

which is smaller to the degree that the complex distortion factor $s_e$ of the single sideband offset device is smaller. By means of algebraic transformations $$\begin{aligned} a &\sim U_{ZF} - s_e\, U^*_{ZF} \\ &= (1 - s_e)\, Re U_{ZF} + j(1 + s_e)\, Im U_{ZF} \\ &\sim Re U_{ZF} + j\frac{1 + s_e}{1 - s_e} Im U_{ZF} \\ &= Re U_{ZF} + p\, Im U_{ZF} = U(p), \end{aligned} \tag{11}$$

it is found that this manner of detection can also be formally treated in the same way as the others previously described.

It is known to establish the complex measuring capacity of such devices by using phase shifting devices having a known phase shift value and a known parasitic amplitude modulation. Alternatively, a cascade of three binary phase shifters having unknown characteristics may be used. Each of the phase shifters is switchable between an on and an off state and by measuring an output signal associated with each of the possible combination of phase shifter states, it is possible to obtain three phase shift values and three amplitude factors. With this arrangement, the three phase shifters must be electrically decoupled from one another and they must operate in a reproducible manner.

SUMMARY OF THE INVENTION

It is an object of the present invention to determine the complex measuring capacity of homodyne network analyzers using signal modifying devices whose characteristics need not be known and which may interact. Moreover, the added circuit devices do not have to operate in a reproducible manner.

Various detection principles can be employed in methods to be described below and a general description will be provided. In what follows a "complex measuring homodyne detector" (KHD) 16 (FIG. 5) is used representatively for all devices which can be calibrated according to the invention and device 16 is characterized by a parameter, namely the weighting factor p. In connection with this it should be noted that in general every detector must be characterized by a different weighting factor. Only in special cases, which will be mentioned in particular, is it possible to assume the same weighting factors.

Establishment of complex measuring capacity is synonymous with the determination of the weighting factors characterizing the measurement points. As already mentioned, this has to occur in situ and will first be explained by reference to a relatively simple but widely used measuring system.

Independently of the principle in which a particular network analyzer operates, the data which it supplies is erroneous. This is due to imperfections such as impedence mismatches, directivity errors, tracking, etc. The calibration of such effects and the removal of errors in measuring systems is called "System Error Correction".

However, while known procedures can produce satisfactory calibration values for hetrodyne detection, the calibration of homodyne detectors presents particular problems because such detectors do not produce complex measurements. Thus, in order to accurately calibrate such detectors, an additional operation is required.

Specifically, in order to obtain accurate calibration values for homodyne network analyzers, it 0 is necessary to obtain a series of measurements which enable a complex calibration factor to be synthesized.

According to the present invention, this is achieved by producing a first set of measurements, with a first set of loads, in the manner contemplated by the prior art, and then producing a second set of measurements after some alteration has been made in the test set up.

It might be noted that the two measurements which are obtained will not correspond to the real and imaginary axes of the complex plane associated with the signals being generated. However, the calibration operation according to the present invention does provide values in a plane whose axes are not necessarily normal to one another. The unknown deformation of the plane axes is determined by the weighting factor to be determined. This determination is the object of the procedure according to the present invention.

Once the weighting factor has been determined, the axes of the plane can be corrected. After this step, the data necessary to effect calibration can be obtained, and this data can then be used in the matter previously employed for heterodyne devices for system error calibration and measurements.

DESCRIPTION OF THE PREFERRED EMBODIMENTS

Reflectometer Circuits with Single Measurement Point.

Figure 1:
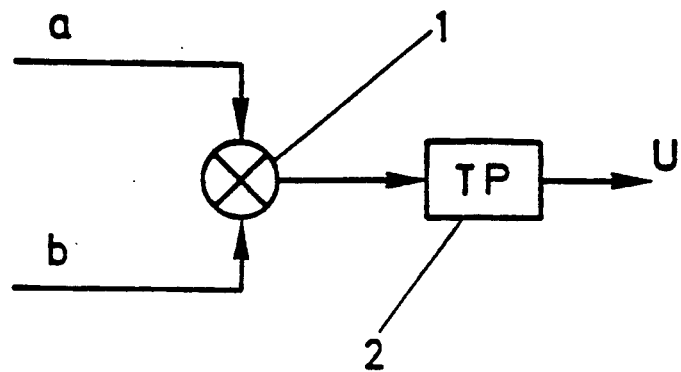
FIGS. 1-4 are circuit diagrams illustrating the basic structure of the measuring portions of homodyne detectors.
Figure 2:
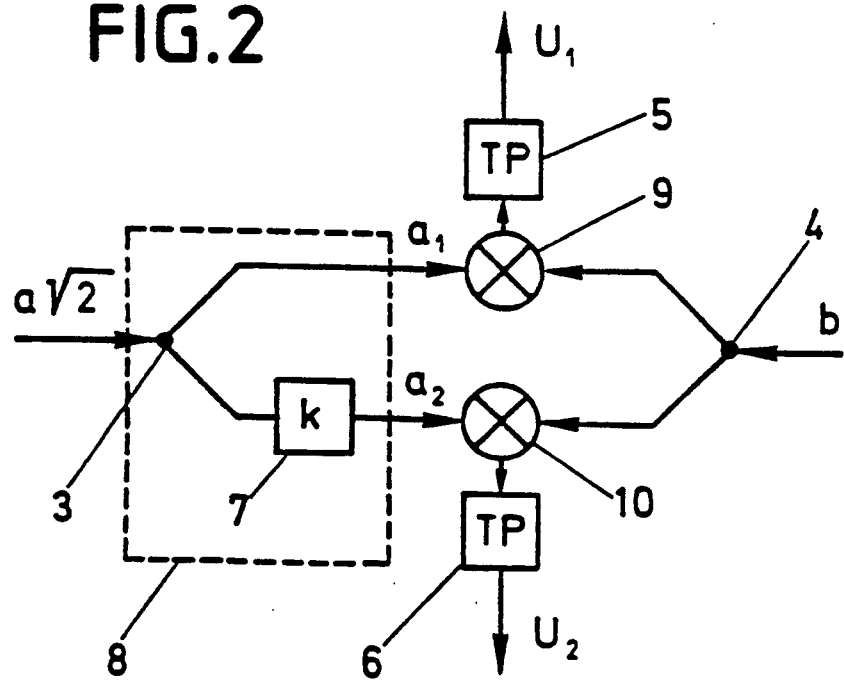
Figure 3:
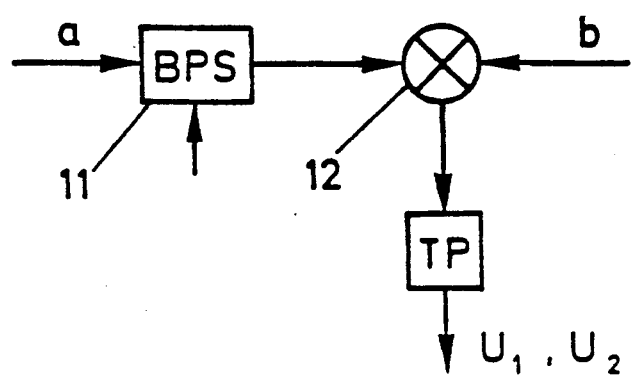
Figure 4:
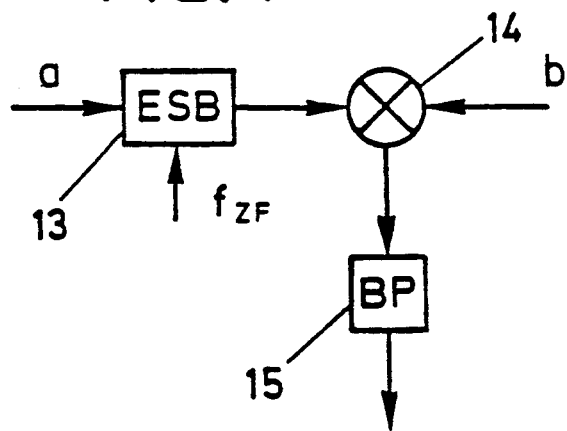
Figure 5:
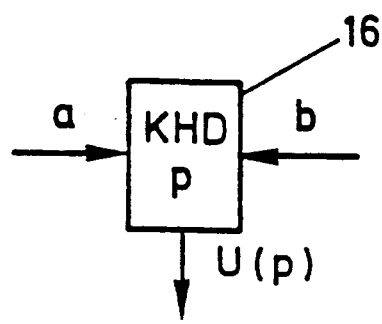
FIG. 5 is a diagram showing the basic symbol for a homodyne detector.
Figure 6:
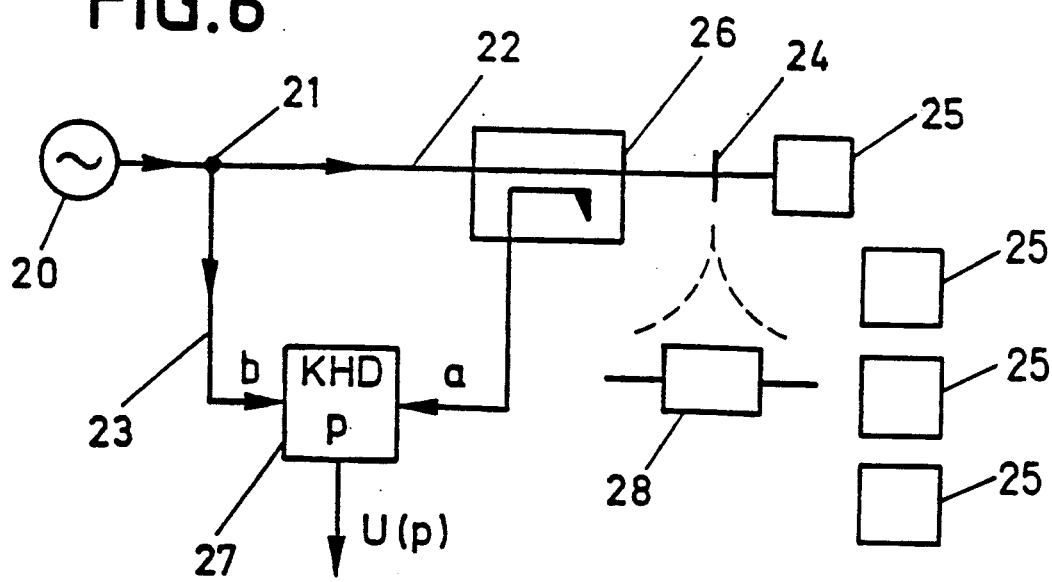
FIGS. 6-12 are circuit diagrams illustrating various calibrating arrangements according to the present invention.

A measuring system of this type is shown in FIG. 6 and represents the state of the art. The device shown is a homodyne detector which can be used to measure reflection coefficients. For that purpose, reflection standards, or test loads 25, are connected to a measuring port 24. During the process of establishing the complex measuring capacity of such a device, a number of different reflection standards are connected to port 24. The electrical characteristics of each of these standards need not be known. The method being used to produce the desired information determines the number of standards required. Typically, four standards are sufficient.

After measurements have been taken with each of those loads connected to port 24, a further two-port device 28 may be connected in series between measuring port 24 and a point of connection for each of the loads. Then, each of the four original loads is connected in turn to device 28, and a further set of measurements is taken. The manner in which these measurements are employed to produce the desired calibration results will be described below. The various test loads could be transmission lines of varying lengths having short circuited terminations. The energy produced by a source 20 is split at 21 into a measurement signal 22 and a local oscillating signal 23. The measurement signal is fed to a measuring port 24, to which a subject to be measured or the reflection standards 25 are connected. The signal reflected there is decoupled by means of a coupler or a similarly acting device 26 and fed to the KHD 27, which provides the complex output voltage in accordance with $U(p) \sim a$, if the parameter p has been correctly selected. It is now required to determine the weighting factor p without the number of exactly known reflection standards exceeding those which are required in any case for the system error calibration. In this reflectometer, there are three standards [8]. The use of reflection standards known neither as to amplitude nor angle, i.e. which are completely unknown standards, can be considered to be a permissible additional effort. Accordingly, the goal of this invention is the separation of the determination of the weighting factor from the systems error correction and to determine the weighting factor exclusively with unknown standards. In connection with the system error correction itself, the procedure is analogous to heterodyne systems.

Therefore it is important in connection with the fictional replacement measurement value $U(p)$ generated that it be suitable for use as a measurement value with which the system can be calibrated. This means that there is a similar connection between the reflection r 25, connected to the measuring port 24, and the value $U(p)$ as the one which exists between r and a, the actual measurement value, i.e., the known bilinear relation $$U(p) = \frac{c_1 + c_2 r}{1 + c_3 r} \quad (12)$$

must exist. If this assured, the following relation, also known as the Moebius transformation, is valid $$\frac{U_3(p) - U_1(p)}{U_3(p) - U_2(p)} \cdot \frac{U_4(p) - U_2(p)}{U_4(p) - U_1(p)} = \frac{r_3 - r_1}{r_3 - r_2} \cdot \frac{r_4 - r_2}{r_4 - r_1}, \quad (13)$$

where $r_1 \ldots r_4$ are four different reflections which are connected to the measuring port 24 and $U_1(p) \ldots U_4(p)$ are the associated complex replacement measurement values. If the same reflections are used as a load on an arbitrary, non-trivial two-port 28, the properties of which need not be known, the same relation applies between the same reflections $r_1 \ldots r_4$ and the operational input reflection factor r of the two-port:

$$\frac{\Gamma_3 - \Gamma_1}{\Gamma_3 - \Gamma_2} \cdot \frac{\Gamma_4 - \Gamma_2}{\Gamma_4 - \Gamma_1} = \frac{r_3 - r_1}{r_3 - r_2} \cdot \frac{r_4 - r_2}{r_4 - r_1} \quad (14)$$

If the two-port loaded in this manner is connected to the measuring port 24, there are produced voltages $U'_1(p), \ldots, U'_4(p)$, and $$\frac{U'_3(p) - U'_1(p)}{U'_3(p) - U'_2(p)} \cdot \frac{U'_4(p) - U'_2(p)}{U'_4(p) - U'_1(p)} = \quad (15)$$

$$\frac{\Gamma_3 - \Gamma_1}{\Gamma_3 - \Gamma_2} \cdot \frac{\Gamma_4 - \Gamma_2}{\Gamma_4 - \Gamma_1} = \frac{r_3 - r_1}{r_3 - r_2} \cdot \frac{r_4 - r_2}{r_4 - r_1},$$

apply, and in connection with Eq. (13)

$$\frac{U_3(p) - U_1(p)}{U_3(p) - U_2(p)} \cdot \frac{U_4(p) - U_2(p)}{U_4(p) - U_1(p)} = \quad (16)$$

$$\frac{U'_3(p) - U'_1(p)}{U'_3(p) - U'_2(p)} \cdot \frac{U'_4(p) - U'_2(p)}{U'_4(p) - U'_1(p)}.$$

Insertion of Eq. (7) results in a characteristic equation for the parameter p, which in the end appears as a fourth order equation in p $$a_4p^4 + a_3p^3 + a_2p^2 + a_1p + a_0 = 0, \quad (17)$$

where the coefficients $a_0 \ldots a_4$ are exclusively composed of the measured voltages and are thus real.

Accordingly, either two conjugated complex pairs of solutions, or
one conjugated complex pair of solutions and two real solutions, or
four real roots can exist.

The case of four real roots cannot occur, because the "correct" p, for which Im $p \neq 0$ applies, also is a solution, so that at least one complex solution exists, but in this case, because of the fundamental principle of algebra, also a second complex root, namely the conjugated complex one, must exist. It turns out that there are two real solutions as well as a conjugated complex pair of solutions. As stated before, the correct solution should be found among the complex roots. The uncertainty as to which one of the two complex-valued solutions is the correct one is typical for difference phase concepts of this type and is easily removed by a rough knowledge of the structure of the detection device KHD or by causality considerations.

By means of the weighting factor p thus determined, the fictionally complex measurement value U(p) can be formed in such a way that Eq. (12) applies and therefore the measurement system can be calibrated and used as a measuring apparatus.

According to a variant of this procedure it is possible to use for the unknown reflection—or at least for part of it—the reflection standards used in connection with the system error correction, so that the associated measurement values can also be used directly for establishing the complex measurement capability. In this way the extra effort is reduced to one single reflection.

Furthermore there is the possibility to determine the weighting factor together with the system error calibration with four known reflection standards, i.e., an additional known standard for the weighting factor, so that the additional two-port is not required.

The state of the art offers the possibility of determining the weighting factor with a total of eight—but at least five—reflection standards, the amplitudes of which are unknown but identical, and the phases of which are unknown, but different [10]. In contrast, the method herein proposed operates with fewer standards, namely four, which furthermore may all be unknown, which clearly makes lesser demands on the production of standards.

Reflectometer Circuit with Dual Measurement Points

The method just described, however, assumes that the signal from source 20 remains constant in amplitude. In many cases it is possible to achieve this to a satisfactory degree by means of technical steps. In case of doubt, or with more stringent requirements, however, it is necessary to obtain a measurement of the wave transmitted to the measured subject.

Figure 7:
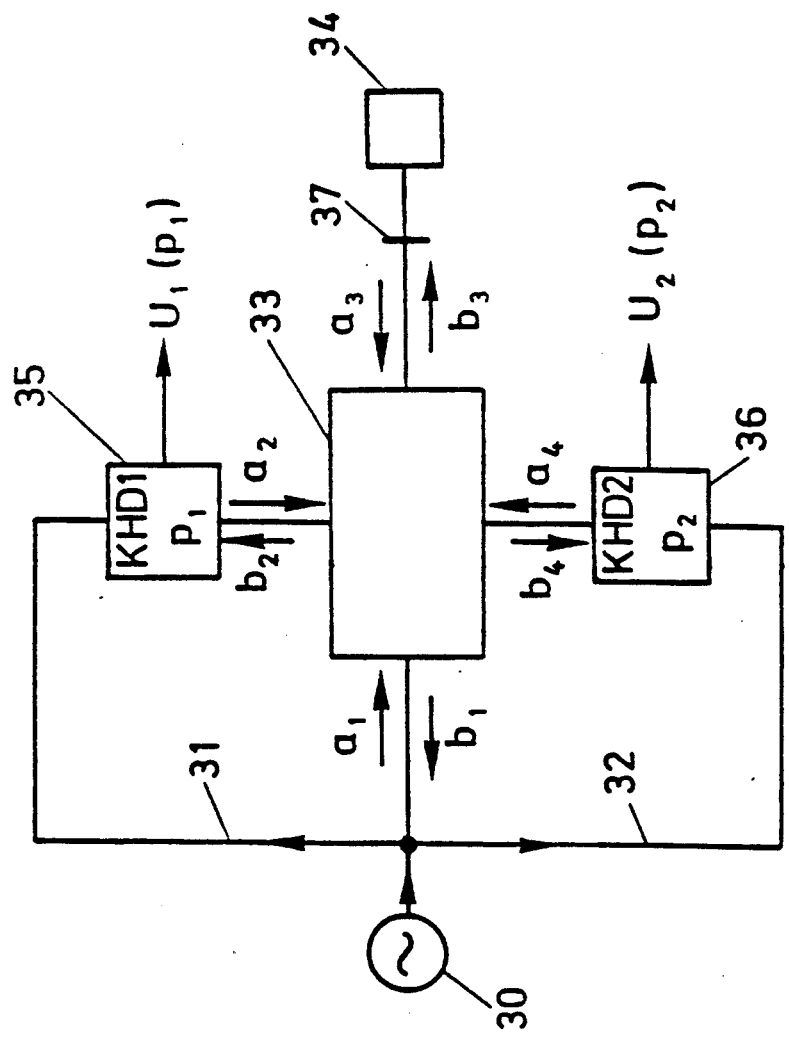

An arrangement for achieving this result is shown in FIG. 7 in which a transmitter 30 supplies, besides the local oscillator branches 31, 32, one port of a four-terminal device 33 which is also connected to the measured subject 34 and two KHDs 35, 36, which may be arbitrarily mismatched and the reflection factors of which are designated by $r_{35}$ and $r_{36}$. The interior of device 33 is arbitrarily designed, however with the requirement that the measurement values of the KHDs are not linearly dependent on one another. For obvious reasons it is suggested to supply one KHD primarily with a forward wave and the other KHD with a reflected wave.

In general, the following is applicable to a four-terminal device:

$$\begin{pmatrix} b_1 \\ b_2 \\ b_3 \\ b_4 \end{pmatrix} = \begin{pmatrix} S_{11} & S_{12} & S_{13} & S_{14} \\ S_{21} & S_{22} & S_{23} & S_{24} \\ S_{31} & S_{32} & S_{33} & S_{34} \\ S_{41} & S_{42} & S_{43} & S_{44} \end{pmatrix} \begin{pmatrix} a_1 \\ a_2 \\ a_3 \\ a_4 \end{pmatrix}, \quad (18)$$

which is algebraically re-formed under the limiting conditions $$a_3 = rb_3, \ a_2 = R_{35} b_2, \ a_4 = r_{36} b_4, \ U_1(p_1) \sim b_2, \\ U_2(p_2) \sim b_4 \quad (19)$$

into $$\begin{pmatrix} U_1(p_1) \\ U_2(p_2) \end{pmatrix} = \begin{pmatrix} A_{11} & A_{12} \\ A_{21} & A_{22} \end{pmatrix} \begin{pmatrix} a_3 \\ b_3 \end{pmatrix} = \begin{pmatrix} A_{11} & A_{12} \\ A_{21} & A_{22} \end{pmatrix} \begin{pmatrix} r \\ 1 \end{pmatrix} b_3, \quad (20)$$

from which finally $$\frac{U_1(p_1)}{U_2(p_2)} = \frac{A_{11}r + A_{12}}{A_{21}r + A_{22}} \overset{def}{=} \Gamma(p_1, p_2) \quad (21)$$

is obtained.

In the case where $U_1(p_1)$ as well as $U_2(p_2)$ can be affected by changes in the reflection r at the measuring port 37, there is the possibility of treating these two values separately from each other the same way as with the single measurement point reflectometer. Otherwise, the value $\Gamma(p_1, p_2)$ is used, analogous to U(p) in Eq. (12), however, other information must be provided by means of four other unknown reflections or another two-port. Since this involves in general mostly additional mathematical effort, it is not treated further here.

Figure 8:
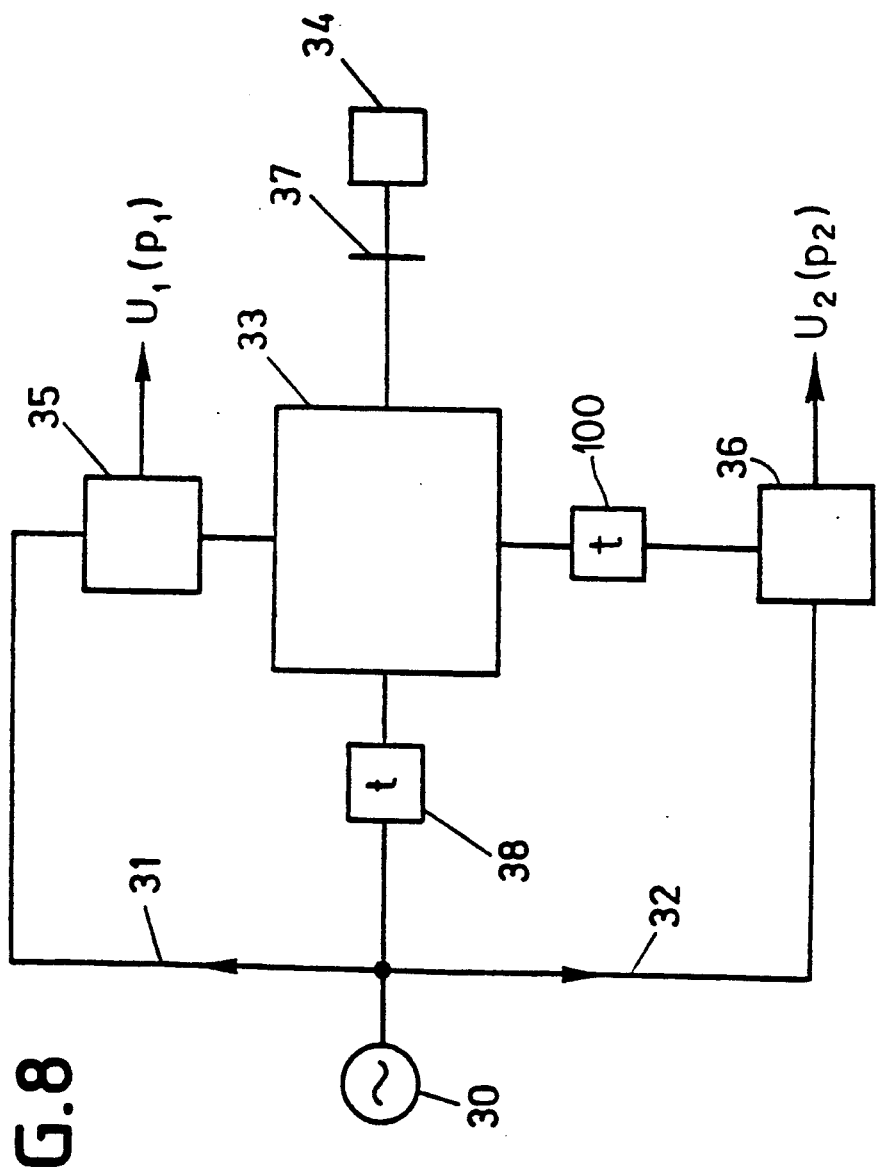

Instead, a method considerably more advantageous regarding the requirement for calibrating standards will be discussed in more detail. In this connection, reference is made to FIG. 8, which results from the addition of a two-port, or two terminal device, 38 to the system of FIG. 7. The added two-port is only needed for establishing the complex measuring capacity, however, it may assume two different states and does not need to operate in a reproducible manner.

In the state I of this two-port 38, the voltages $U_1(p_1)$ and $U_2(p_2)$ are measured at the measuring port 37 on the detectors 35 and 36 during a first arbitrary reflection, in the state II $U'_1(p_1)$ and $U'_2(p_2)$ are measured. Since reversal causes the change by an unknown, but common, factor t of all wave values at the quad port 33, which on the basis of proportionality in accordance with Eq. (7) also applies to the replacement values $U_1(p_1)$ and $U_2(p_2)$, the following associations exist:

$$\text{State I:} \quad U_1(p_1) \qquad U_2(p_2) \tag{22}$$
$$\text{State II:} \quad U'_1(p_1) = t\, U_1(p_1) \quad U'_2(p_2) = t\, U_2(p_2).$$

A characteristic equation is obtained by the formation of quotients:

$$\frac{U'_1(p_1)}{U'_2(p_2)} = \frac{t\, U_1(p_1)}{t\, U_2(p_2)} = \frac{U_1(p_1)}{U_2(p_2)} \longrightarrow \tag{23}$$

$$U_1(p_1)U'_2(p_2) - U'_1(p_1)U_2(p_2) = 0. \tag{24}$$

Since there are two complex unknowns which must be determined, a second such equation must be made available, which is done by applying another, but also arbitrary and unknown, reflection to measuring port 37.

Elimination of, for example, $p_2$ leads to a quadratic equation for the determination of $p_1$:

$$a_2 p_1^2 + a_1 p_1 + a_0 = 0. \tag{25}$$

Because the coefficients consist exclusively of real-value mixer output voltages, only one conjugated complex pair of solutions would be considered as roots, taking into consideration the above explanations. The choice between these two solutions should be made in the manner already described. It is possible to calculate $p_2$ via Eq. (24) with p1 thus determined, so that it is possible to actually form the values $U_1(p_1)$ and $U_2(p_2)$.

With this the complex measuring capability has been established.

Here again there is the possibility of using the standards which are required anyway for the calibration of the system errors as concrete realization of the arbitrary unknown reflections.

In all cases the two-port 38 can remain in an arbitrary state for further operation or it may be removed.

Arbitrarily Coupled Reflectometer

A general measurement apparatus will be considered.

Figure 9:
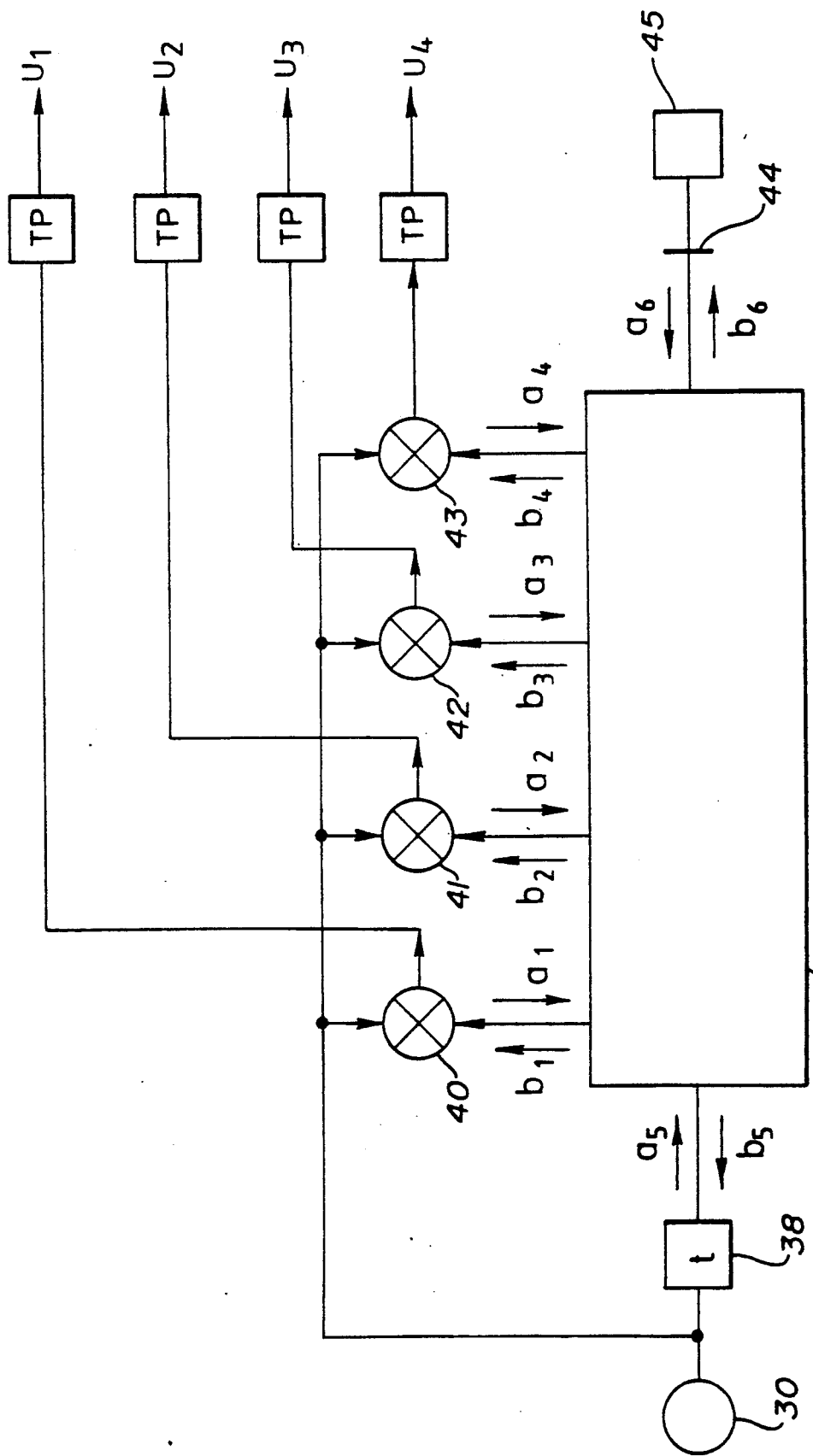

The basis of the description is FIG. 9. The source 30 supplies, via the two-port 38 which can be placed in two different states which need not be further known nor be reproducible, a structure 39 with six ports, four of which are equipped with mixers 40, 41, 42 and 43 as detectors, and one of which is the measuring port 44, to which various reflection sources 45 and among them also the subject to be measured are connected. In this general case, which allows arbitrary couplings within the six-port, a description of the KHD is no longer possible with only one complex weighting factor. Therefore, the concept of the KHD used up to now must be left behind and a new description used.

Six-port structure 39 can have an arbitrarily constructed internal structure, provided that the four measurement values provided by the mixers are not linearly dependent from each other. Because of this there is a certain similarity to the so-called six-port method [4] which is limited to these obvious requirements. The measuring procedures and the detection principles differ considerably and as will be shown—surpass the method proposed there as to the information provided as well as to the measuring dynamics.

The physically present six-port structure 39, the mismatching and the degrees of efficiency of the detectors are combined, without restriction of the generalities, into a new fictional six-port, analogous in its conception to Eqs. (18)-(20). In this case, $a_1 = a_2 = a_3 = a_4 = 0$ applies to the wave values at the ports of the fictional six-port, and the following relation obtains between the wave values different from zero $$\begin{pmatrix} b_1 \\ b_2 \\ b_3 \\ b_4 \\ b_5 \\ b_6 \end{pmatrix} = \begin{pmatrix} S_{15} & S_{16} \\ S_{25} & S_{26} \\ S_{35} & S_{36} \\ S_{45} & S_{46} \\ S_{55} & S_{56} \\ S_{65} & S_{66} \end{pmatrix} \begin{pmatrix} a_5 \\ a_6 \end{pmatrix}. \tag{26}$$

which, by algebraic transformation, can be compressed into the statement $$\begin{pmatrix} b_3 \\ b_4 \end{pmatrix} = \begin{pmatrix} \gamma_{11} & \gamma_{12} \\ \gamma_{21} & \gamma_{22} \end{pmatrix} \begin{pmatrix} b_1 \\ b_2 \end{pmatrix} \tag{27}$$

where the coefficients $\gamma_{ij}$ exclusively depend on the parameters of the six-port and of the detectors, i.e., are characteristic for the measuring arrangement.

Since the detection of the wave lengths $b_1 \ldots b_4$ constitutes a coherent mixing process, only real measurement values are available, namely in accordance with the preliminary considerations regarding Eqs. (2) and (4)

$$U_1 = \mathrm{Re}\, b_1,\ U_2 = \mathrm{Re}\, b_2,\ U_3 = \mathrm{Re}\, b_3,\ U_4 = \mathrm{Re}\, b_4. \tag{28}$$

The linkage of Eq. (27) with Eq. (28) is supplied by $$\begin{aligned}
\mathrm{Re}\,b_3 &= \mathrm{Re}\{\gamma_{11}b_1 + \gamma_{12}b_2\} = \mathrm{Re}\{\gamma_{11}b_1\} + \mathrm{Re}\{\gamma_{12}b_2\} \\
&= \mathrm{Re}\gamma_{11}\mathrm{Re}b_1 - \mathrm{Im}\gamma_{11}\mathrm{Im}b_1 + \\
&\quad \mathrm{Re}\gamma_{12}\mathrm{Re}b_2 - \mathrm{Im}\gamma_{12}\mathrm{Im}b_2,
\end{aligned} \tag{29}$$

$$\begin{aligned}
\mathrm{Re}\,b_4 &= \mathrm{Re}\{\gamma_{21}b_1 + \gamma_{22}b_2\} = \mathrm{Re}\{\gamma_{21}b_1\} + \mathrm{Re}\{\gamma_{22}b_2\} \\
&= \mathrm{Re}\gamma_{21}\mathrm{Re}b_1 - \mathrm{Im}\gamma_{21}\mathrm{Im}b_1 + \\
&\quad \mathrm{Re}\gamma_{22}\mathrm{Re}b_2 - \mathrm{Im}\gamma_{22}\mathrm{Im}b_2,
\end{aligned} \tag{30}$$

which, by means of algebraic transformation, changes to $$\mathrm{Im}\,b_1 = \sum_{i=1}^{4} a_i \mathrm{Re}\,b_i = \sum_{i=1}^{4} a_i U_i, \tag{31}$$

-continued
$$Imb_2 = \sum_{i=1}^{4} \beta_i Reb_i = \sum_{i=1}^{4} \beta_i U_i, \quad (32)$$

where $\alpha_i \beta_i$ are real, unknown constants of the measuring system, exclusively dependent from the parameters of the six-port and the detectors, and $U_i$ are the measured real-value voltages.

Thus, the waves $b_1$ and $b_2$ are formally reconstructed according to $$b_1 = Reb_1 + jImb_1 = U_1 + j \sum_{i=1}^{4} \alpha_i U_i, \quad (33)$$

$$b_2 = Reb_2 + jImb_2 = U_2 + j \sum_{i=1}^{4} \beta_i U_i. \quad (34)$$

A change in the state of the two-port 38 again causes all wave values in the six-port structure to change by an unknown, but common, factor t, which primarily depends on the properties of the two-port, but is also affected by the parameters of the six-port and of the detectors, and even by the reflection actually connected at the measuring port.

Analogously to Eqs. (33) and (34), $$tb_1 = Re\{tb_1\} + jIm\{tb_1\} = U'_1 + j \sum_{i=1}^{4} \alpha_i U'_i, \quad (35)$$

$$tb_2 = Re\{tb_2\} + jIm\{tb_2\} = U'_2 + j \sum_{i=1}^{4} \beta_i U'_i, \quad (36)$$

are noted, where $U_i'$ represents the real-value mixer output voltages which can be measured in this state.

A characteristic equation is arrived at by means of division:

$$\frac{U_1 + j \sum_{i=1}^{4} \alpha_i U_i}{U_2 + j \sum_{i=1}^{4} \beta_i U_i} = \frac{b_1}{b_2} \quad (37)$$

$$\frac{U'_1 + j \sum_{i=1}^{4} \alpha_i U'_i}{U'_2 + j \sum_{i=1}^{4} \beta_i U'_i} = \frac{tb_1}{tb_2} = \frac{b_1}{b_2} \longrightarrow \quad (38)$$

$$\left( U_1 + j \sum_{i=1}^{4} \alpha_i U_i \right)\left( U'_2 + j \sum_{i=1}^{4} \beta_i U'_i \right) - \quad (39)$$
$$\left( U'_1 + j \sum_{i=1}^{4} \alpha_i U'_i \right)\left( U_2 + j \sum_{i=1}^{4} \beta_i U_i \right) = 0.$$

Because this equation is a complex one, for equations of this type are required for the determination of the eight real constants $\alpha_i, \beta_i$, which are made available by the connection of four different, unknown reflection standards.

$$\left( U_{n,1} + j \sum_{i=1}^{4} \alpha_i U_{n,i} \right)\left( U'_{n,2} + j \sum_{i=1}^{4} \beta_i U'_{n,i} \right) - \quad (40)$$
$$\left( U'_{n,1} + j \sum_{i=1}^{4} \alpha_i U'_{n,i} \right)\left( U_{n,2} + j \sum_{i=1}^{4} \beta_i U_{n,i} \right) = 0,$$

-continued
$$n = 1, 2, 3, 4$$

This equation system has two sets of $\alpha_i, \beta_i$ ar solutions $$\{\alpha_{1,1}, \alpha_{1,2}\alpha_{1,3}\alpha_{1,4}\beta_{1,2}, \beta_{1,3}, \beta_{1,4}\} \quad (41)$$

and $$\{\alpha_{2,1}, \alpha_{2,2}\alpha_{2,3}\alpha_{2,4}\beta_{2,2}, \beta_{2,3}, \beta_{2,4}\} \quad (42)$$

which change into each other by multiplication by $-1$ $$\alpha_{1,i} = -\alpha_{2,i}, \beta_{1,i} = -\beta_{2,i}, i = 1,2,3,4. \quad (43)$$

To select the correct set, both are inserted into Eqs. (33) and (35) (or Eqs. (34) and (36)), so that the factor t can be reconstructed by quotient formation $$t_1 = \frac{U'_1 + j \sum_{i=1}^{4} \alpha_{1,i} U'_i}{U_1 + j \sum_{i=1}^{4} \alpha_{1,i} U_i} \quad (44)$$

$$t_2 = \frac{U'_1 + j \sum_{i=1}^{4} \alpha_{2,i} U'_i}{U_1 + j \sum_{i=1}^{4} \alpha_{2,i} U_i} \quad (45)$$

which results, of course, in two different values. Because of Eq. (43), $$t_1 = t_2^*, \quad (46)$$

applies, which is an ambiguity in the sense previously discussed, which again is removed according to the same considerations.

In this way the parameters $\alpha_i, \beta_i$ are available for reconstructing the complex wave values $b_1$ and $b_2$ by means of Eqs. (33) and (34), so that the complex measurability has been established.

As will be shown later, the two complex wave values $b_1$ and $b_2$ are inserted into the subsequent system error calibration, if the circuit described is a part of a two-port measuring device. Only during operation of the device as a single reflectometer is the replacement value $$\frac{b_1}{b_2} = \frac{U_1 + j \sum_{i=1}^{4} \alpha_i U_i}{U_2 + j \sum_{i=1}^{4} \beta_i U_i} \stackrel{def}{=} \Gamma \quad (47)$$

formed, which then serves as a measuring value for the subsequent system error calibration.

Here, notice should be taken of an important difference in respect to the state of the art, the conventional six-port method with output meters:

The method according to the invention succeeds in reconstructing two wave values separately, namely, for example, $b_1$ and $b_2$, while the former provides only one, namely the quotient $r = b_1/b_2$. This advantage has far-reaching consequences in connection with the combination of two such reflectometers into a double reflectometer suitable for multi-port measurements. This and further decisive advantages will be discussed further at the end of the description.

Following the previous discussions of reflectometer circuits, a transition will now be made to double reflectometer devices. These comprise two single reflectometers, so that it becomes possible to measure two-ports or even multi-ports.

For one, it is possible to consider each reflectometer separately for establishing the complex measuring capability. In this case there are no changes from what has been said before. Furthermore, the known or unknown reflections can be replaced by known or unknown two-ports. This saves effort and, under certain circumstances, also calculation effort, but does not mean a basic difference. Therefore the explanation of the double reflectometer devices will be limited to qualitatively different methods.

To address the problems, first that part of the device in which complex-value signals exist will again be discussed. The connections characteristic in regard to homodyne systems will then be explained with the aid of this background.

General Discussion

Figure 10:
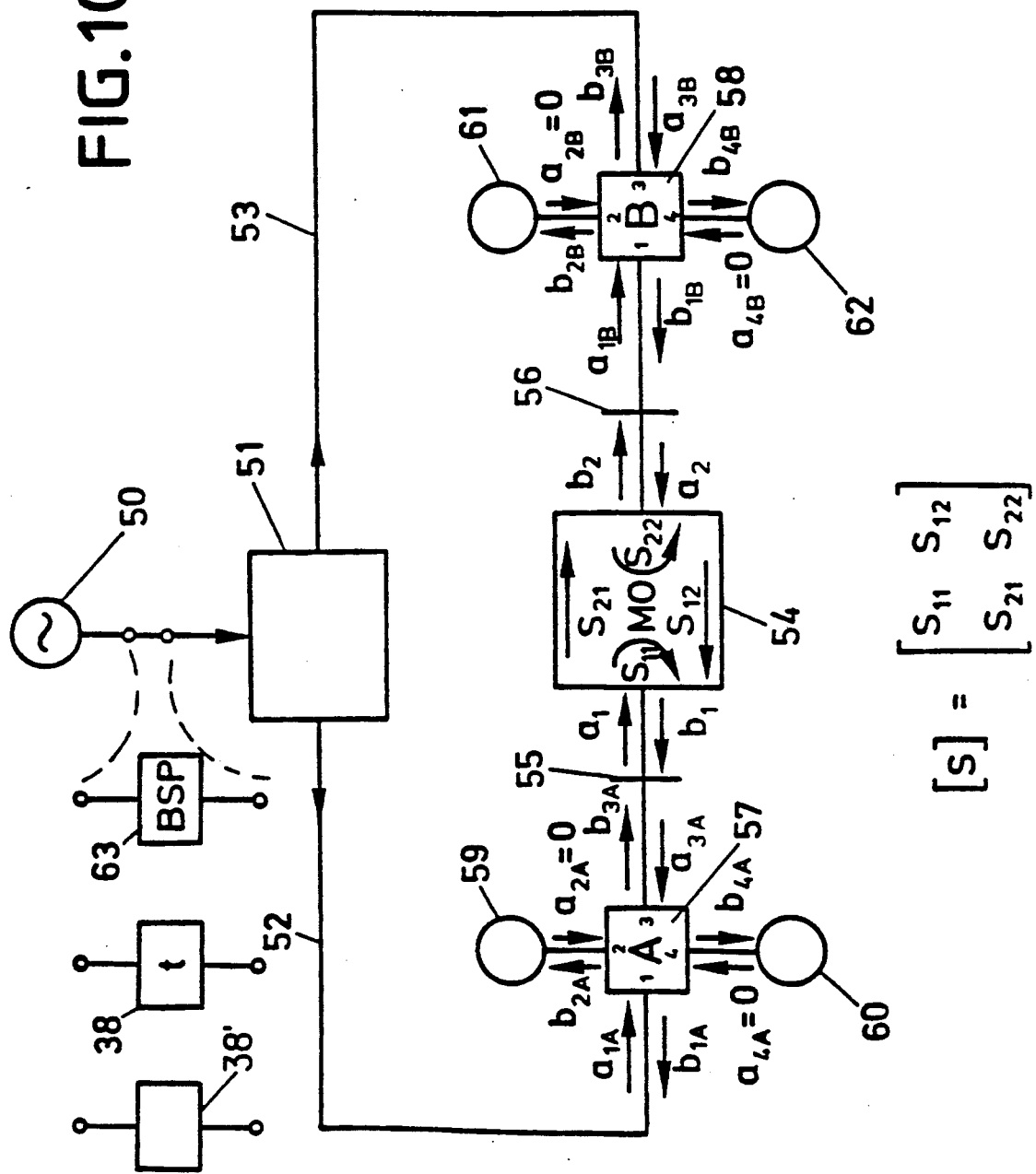

A model shown in FIG. 10 will be the basis of the discussion. A signal source 50 supplies a three-port 51 which distributes energy to two measurement branches 52 and 53. Three-port 51 has two different signal distribution states which can be realized, for example, by means of a change-over switch. Alternately to this, the three-port 51 can provide two different states contemporaneously. For this purpose it would provide the two output signals with different modulations, so that the information in regard to the two states is available at the same moment. In many cases it is not permissible to expose the measurement subject 54 to modulated signals, so that all discussion will take place on the basis of time-serial realization.

Between the three-port 51 and each of measuring ports 55 and 56, which are accessible from the outside and to which the subject to be measured 54 is connected, a respective quad port 57 or 58 is disposed. Signal detectors 59 and 60 or 61 and 62, which measure magnitude and phase, are connected to ports 2 and 4 of quad ports 57 or 58 and may also be mismatched.

The quad port 57, the measuring port 55 and the detectors 59 and 60 are conceptually, without restriction of the generalities, interpreted by displacement of the planes of references as a quad port, incorporating the inadequacies of 55, 59 and 60, and two ideally operating detectors. Between the complex wave amplitudes at the ports of these quad ports the following relations apply (see Eqs. (18)–(20))

$$b_{1A} = S_{11A}a_{1A} + S_{13A}a_{3A} \tag{48}$$
$$b_{2A} = S_{21A}a_{1A} + S_{23A}a_{3A} \tag{49}$$
$$b_{3A} = S_{31A}a_{1A} + S_{33A}a_{3A} \tag{50}$$
$$b_{4A} = S_{41A}a_{1A} + S_{43A}a_{3A} \tag{51}$$

which are brought into the form of $$\begin{pmatrix} b_{2A} \\ b_{4A} \end{pmatrix} = \begin{pmatrix} A_{11} & A_{12} \\ A_{21} & A_{22} \end{pmatrix} \begin{pmatrix} a_{3A} \\ b_{3A} \end{pmatrix} \tag{52}$$

In connection with the description of the part of the measuring device comprised of 56, 58, 61 and 62, a procedure analogous to the one above is being followed. The connections between the complex wave amplitudes at the ports of the quad-port which are created in the process $$b_{1B} = S_{11B}a_{1B} + S_{13B}a_{3B} \tag{53}$$
$$b_{2B} = S_{21B}a_{1B} + S_{23B}a_{3B} \tag{54}$$
$$b_{3B} = S_{31B}a_{1B} + S_{33B}a_{3B} \tag{55}$$
$$b_{4B} = S_{41B}a_{1B} + S_{43B}a_{3B} \tag{56}$$

are brought into the following form $$\begin{pmatrix} b_{2B} \\ b_{4B} \end{pmatrix} = \begin{pmatrix} B_{11} & B_{12} \\ B_{21} & B_{22} \end{pmatrix} \begin{pmatrix} b_{1B} \\ a_{1B} \end{pmatrix} \tag{57}$$

To describe the cooperation of the partial systems described up to now, a two-port with the transmission parameter matrix T, switched between the measurement ports 55 and 56, will be considered $$\begin{pmatrix} b_1 \\ a_1 \end{pmatrix} = \begin{pmatrix} T_{11} & T_{12} \\ T_{21} & T_{22} \end{pmatrix} \begin{pmatrix} a_2 \\ b_2 \end{pmatrix}. \tag{58}$$

which, based on the marginal conditions $$b_1 = a_{3A},\ a_1 = b_{3A},\ a_2 = b_{1B}\ \text{and}\ b_2 = a_{1B} \tag{59}$$

leads, with the use of Eqs. (52) and (57), to $$\begin{pmatrix} b_{2A} \\ b_{4A} \end{pmatrix} = \begin{pmatrix} A_{11} & A_{12} \\ A_{21} & A_{22} \end{pmatrix} \begin{pmatrix} T_{11} & T_{12} \\ T_{21} & T_{22} \end{pmatrix} \begin{pmatrix} B_{11} & B_{12} \\ B_{21} & B_{22} \end{pmatrix}^{-1} \begin{pmatrix} b_{2B} \\ b_{4B} \end{pmatrix} \tag{60}$$

Equation (60) describes the arrangement in the first of the two states which the three-port 51 can assume. The reference values of both states may be completely unknown, it need only be assured that they lead to linearly independent measurement values. The operation of the measuring device in its second state involves changed measurement values, which are marked with a prime ('), so that analogously to Eq. (60) the following now applies:

$$\begin{pmatrix} b_{2A}' \\ b_{4A}' \end{pmatrix} = \begin{pmatrix} A_{11} & A_{12} \\ A_{21} & A_{22} \end{pmatrix} \begin{pmatrix} T_{11} & T_{12} \\ T_{21} & T_{22} \end{pmatrix} \begin{pmatrix} B_{11} & B_{12} \\ B_{21} & B_{22} \end{pmatrix}^{-1} \begin{pmatrix} b_{2B}' \\ b_{4B}' \end{pmatrix} \tag{61}$$

The combination of the two vector equations results in the matrix equation $$\begin{pmatrix} b_{2A} & b_{2A}' \\ b_{4A} & b_{4A}' \end{pmatrix} = \tag{62}$$

$$\begin{pmatrix} A_{11} & A_{12} \\ A_{21} & A_{22} \end{pmatrix} \begin{pmatrix} T_{11} & T_{12} \\ T_{21} & T_{22} \end{pmatrix} \begin{pmatrix} B_{11} & B_{12} \\ B_{21} & B_{22} \end{pmatrix}^{-1} \begin{pmatrix} b_{2B} & b_{2B}' \\ b_{4B} & b_{4B}' \end{pmatrix},$$

which is written as $$M = A\,T\,B^{-1} \tag{63}$$

where $$M = \begin{pmatrix} b_{2A} & b_{2A}' \\ b_{4A} & b_{4A}' \end{pmatrix} \begin{pmatrix} b_{2B} & b_{2B}' \\ b_{4B} & b_{4B}' \end{pmatrix}^{-1} \tag{64}$$

is composed of measurement values and $$A = \begin{pmatrix} A_{11} & A_{12} \\ A_{21} & A_{22} \end{pmatrix}, T = \begin{pmatrix} T_{11} & T_{12} \\ T_{21} & T_{22} \end{pmatrix}; B = \begin{pmatrix} B_{11} & B_{12} \\ B_{21} & B_{22} \end{pmatrix} \tag{65}$$

If the elements of the matrices A and B are known, it is possible to determine from the measurement values $$MX = A \, NX \, B^{-1} \tag{66}$$

in connection with an unknown measured subject with the transmission matrix NX the parameters of the measured subject by means of $$NX = A^{-1} \, MX \, B \tag{67}$$

The determination of the matrices A and B is the responsibility of a system error correction, thus not the subject of this discussion. In this connection it can be assumed that it can be determined, if needed, for example by means of the method in accordance with [2], [3], [4], [6]. The object of the present invention is to provide methods for supplying suitable complex-value measurement value matrices by means of homodyne-operating measuring devices.

Calibration by Means of Unknown Externals Standards

To explain these methods, various cases are cited which may occur in homodyne-operating arrangements. For this purpose the signals of interest, $b_{2A}$, $b_{4A}$, $b_{2B}$, $b_{4b}$, are supplied to complex measuring homodyne detectors (KHD). This means that the complex measurement detectors 59, 60, 61 and 62 are replaced by KHDs. Each one of these is characterized by an unknown weighting factor, which in general is different from one detector to the other and are formally noted in the weighting vector $p = (p_1, p_2, p_3, p_4)$.

It is possible to formulate, analogously to Eqs. (60)–(62)

$$\begin{pmatrix} U_1(p_1) \\ U_2(p_2) \end{pmatrix} = \tag{68}$$

$$\begin{pmatrix} A_{11} & A_{12} \\ A_{21} & A_{22} \end{pmatrix} \begin{pmatrix} T_{11} & T_{12} \\ T_{21} & T_{22} \end{pmatrix} \begin{pmatrix} B_{11} & B_{12} \\ B_{21} & B_{22} \end{pmatrix}^{-1} \begin{pmatrix} U_3(p_3) \\ U_4(p_4) \end{pmatrix},$$

$$\begin{pmatrix} U_1'(p_1) \\ U_2'(p_2) \end{pmatrix} = \tag{69}$$

$$\begin{pmatrix} A_{11} & A_{12} \\ A_{21} & A_{22} \end{pmatrix} \begin{pmatrix} T_{11} & T_{12} \\ T_{21} & T_{22} \end{pmatrix} \begin{pmatrix} B_{11} & B_{12} \\ B_{21} & B_{22} \end{pmatrix}^{-1} \begin{pmatrix} U_3'(p_3) \\ U_4'(p_4) \end{pmatrix}$$

and thus by way of the combination of the two vector equations the matrix equation $$\begin{pmatrix} U_1(p_1) & U_1'(p_1) \\ U_2(p_2) & U_2'(p_2) \end{pmatrix} = \tag{70}$$

$$\begin{pmatrix} A_{11} & A_{12} \\ A_{21} & A_{22} \end{pmatrix} \begin{pmatrix} T_{11} & T_{12} \\ T_{21} & T_{22} \end{pmatrix} \begin{pmatrix} B_{11} & B_{12} \\ B_{21} & B_{22} \end{pmatrix}^{-1} \begin{pmatrix} U_3(p_3) & U_3'(p_3) \\ U_4(p_4) & U_4'(p_4) \end{pmatrix}$$

or $$M_A(p) = A \, T \, B^{-1} \, M_B(p) \rightarrow M_A(p) \, M_B(p)^{-1} = M(p) = A \, T \tag{71}$$
$$B^{-1}$$

by means of which a representation has been found which equals the complex-value problem, albeit in parameterized form.

Now two arbitrary but different two-ports are measured with the unknown transmission matrices N1 and N2, the associated measurement values of which are noted by $$M1(p) = A \, N1 \, B^{-1} \tag{72}$$

$$M2(p) = A \, N2 \, B^{-1} \tag{73}$$

in relation to the still unknown weighting factor p, by means of which $$Q(p) = (M2_A(p) \, M2_B(p)^{-1})(M1_A(p) \, M1_B(p)^{-1} \tag{74}$$

is formed. For the determinant of Q(p)

$$det Q(p) = \frac{det M2_A(p) \, det M1_B(p)}{det M2_B(p) \, det M1_A(p)} \tag{75}$$

applies. It is also possible to make a further statement in connection with Q(p), namely $$det Q(p) = det(M2 \, M1^{-1}) = det(A \, N2 \, B^{-1} \, (A \, N1 \, B^{-1})^{-1}) \tag{76}$$
$$= \frac{det N2}{det N1}.$$

If N1 and N2 now are transmission matrices belonging to reciprocal networks, then $$det \, N1 = det \, N2 = 1, \tag{77}$$

applies and it is possible to claim $$det Q(p) = \frac{det M2_A(p) \, det M1_B(p)}{det M2_B(p) \, det M1_A(p)} = 1 \tag{78}$$

or $$det M2_A(p) \, det M1_B(p) - det M2_B(p) \, det M1_A(p) = 0 \tag{79}$$

Reciprocity is a basic physical property, which can be assured by elementary claims. For example, passive structures of isotropic materials are always reciprocal, regardless of the actual design and complexity of the device. This means that the reciprocity and thus the validity of Eq. (77) can always be assured without technical effort.

Now for some special cases.

Single-p Methods

It is possible to achieve (approximately) by design steps the characterization of all KHD by one and the same weighting factor $p_i = p$, $i = 1,2,3,4$. This can be achieved, for example, by disposing the phase switches of the KHD in the local oscillator branch, so that not each KHD has a separate phase switch, but this function is performed for all of them together by a single phase switch 63 (FIG. 10) of as low as possible parasitic amplitude modulation. The degree to which the assumption of the identical weighting factors has been actually fulfilled can, if needed, be checked by means of the also simpler methods according to the invention.

For the determination of the common weighting factor p, the characteristic equation $$a_4 p^4 + a_3 p^3 + a_2 p^2 + a_1 p + a_0 = 0 \tag{80}$$

is derived from Eq. (79) by algebraic transformation, the real coefficients $a_i$ are exclusively comprised of the measured voltages. The equation (8) is to be solved by suitable methods. For example, satisfactory results can be achieved with the method of Müller [11].

However, alternately it is possible to take a linear approach which, at the cost of an additional calibrating standard, permits a simpler mathematical operation. The complex signals and measurement value matrices are reconstructed by means of the weighting factor p in accordance with Eqs. (70)-(71), so that it is possible to proceed as in the complex case.

In a modification of an embodiment described above, with respect to FIG. 9, those two-ports are used for the required two or three, which are needed anyway because of the required measurements for the system error correction. Then, by conventional calibration measurements, all data for determining the weighting factor are already available, without an additional effort being required.

Phase modulators often have a parasitic amplitude modulation in actual use. Starting with a certain magnitude of this phenomenon it may no longer be permissible to apply the solution utilized above in connection with the single p method, because the phase modulator is located in the non-linear branch of the mixers. Because of the not exactly similar dependency of the conversion properties of the mixers on the pump output, it would be required to characterize each mixer by a different weighting factor. In order to succeed in this case in spite of this, a number of procedures are imaginable, which have different consequences.

Double-p Method

This method is characterized in that two different weighting factors are required and suffice for its description. For example, such a case may occur because the phase switch is disposed in the linear branch of the mixer, i.e. in the signal branch. In FIG. 10, a binary phase switch 63 is introduced which replaces the respective phase switch 11 for all KHDs together. The input impedance, which changes with the switch position, leads to an effective phase shift of the phase switch, which depends on the switch position and thus to a weighting factor dependent on the switch position. Therefore $p = (p_1, p_1, p_2, p_2)$ must be inserted, where $p_1$ belongs to switch state I and $p_2$ to switch state II of the three-port 51.

$$\begin{pmatrix} U_1(p_1) & U_1'(p_2) \\ U_2(p_1) & U_2'(p_2) \end{pmatrix} = \tag{81}$$

$$\begin{pmatrix} A_{11} & A_{12} \\ A_{21} & A_{22} \end{pmatrix} \begin{pmatrix} T_{11} & T_{12} \\ T_{21} & T_{22} \end{pmatrix} \begin{pmatrix} B_{11} & B_{12} \\ B_{21} & B_{22} \end{pmatrix}^{-1} \begin{pmatrix} U_3(p_1) & U_3'(p_2) \\ U_4(p_1) & U_4'(p_2) \end{pmatrix}$$

A procedure analogous to Eqs. (75)-(78) supplies $$\det M2_A(p_1,p_2) \det M1_B(p_1,p_2) - \det M2_B(p_1,p_2) \det M1_A(p_1,p_2) = 0 \tag{82}$$

which leads to characteristic equation of the type $$\sum_{n=0}^{2} \sum_{m=0}^{2} a_{m+3n} p_2^n p_1^m = 0 \tag{83}$$

The third two-port 38', added in connection with the single p method only in the interest of a simplified solution process, is always needed in this case, because at least two equations must be provided for two unknowns. Therefore the equation system $$\sum_{n=0}^{2} \sum_{m=0}^{2} a_{i,m+3n} p_2^n p_1^m = 0, \quad i = 1, 2 \tag{84}$$

is available.

Three reciprocal but otherwise completely unknown two-ports suffice for the determination of the weighting factors associated with two different effective phase shifts.

Besides this direct solution here again there is the possibility to arrive at a linear solution path by the addition of further two-ports. In this case five different, unknown, reciprocal two-ports must be used.

4-p Method

This method is needed if no description of the device can be found which makes possible a description in accordance with the single-p or double-p methods. This may be the case, for example, if the phase switch is left in the l.o. branch and the necessity of characterizing each measurement point by a different weighting factor is accepted. In this case the following applies:

$$\begin{pmatrix} U_1(p_1) & U_1'(p_1) \\ U_2(p_2) & U_2'(p_2) \end{pmatrix} = \tag{85}$$

$$\begin{pmatrix} A_{11} & A_{12} \\ A_{21} & A_{22} \end{pmatrix} \begin{pmatrix} T_{11} & T_{12} \\ T_{21} & T_{22} \end{pmatrix} \begin{pmatrix} B_{11} & B_{12} \\ B_{21} & B_{22} \end{pmatrix}^{-1} \begin{pmatrix} U_3(p_3) & U_3'(p_3) \\ U_4(p_4) & U_4'(p_4) \end{pmatrix}$$

Again, an analogous process leads to a system of characteristic equations $$\sum_{n=0}^{1} \sum_{m=0}^{1} \sum_{k=0}^{1} \sum_{i=0}^{1} a_{i,l+2k+4m+8n} p_4^n p_3^m p_2^k p_1^l = 0, \tag{86}$$

$$i = 1, 2, 3, 4.$$

Since there are four unknowns, the system contains four, $i=1,2,3,4$, equations. If N is the number of the different, unknown, reciprocal calibration two-ports, $$4 \leq \frac{N!}{2!(N-2)!} \qquad (87)$$

must apply, because two linked measurements supply one equation. It therefore follows that four such two-ports are sufficient and that there are even six equations available.

The equation system Eq. (86) can be solved numerically, as in the previous cases, but again can be brought to a linear solution by an increased number of calibration two-ports.

Now that the weighting factor(s) has (have) been determined, the complex measurement values linked with the measured real voltages can be reconstructed, so that the system can be further treated the same as every complex measuring one.

Complete Self-Calibration

Following these explanations concerned with methods which always require a certain number of (unknown) calibrating two-ports, a method operating without any standard will be discussed below. For this reason the set up of the reflectometer measuring arrangement in accordance with FIG. 8 will be considered in connection with a double reflectometer in accordance with FIG. 10. The two-port 38 must be disposed analogously to, i.e., in place of, the phase switch 63 in this case.

Besides the possibility, already mentioned, of treating each of the two reflectometers individually, or the possibility to exchange the reflection standards with two-port standards (also unknown, non-reciprocal), a further method can be used. For this purpose the two measuring ports are arbitrarily connected with each other which may be, in the particular case, a direct connection of the two ports. To determine the weighting factor, the state I and the state II are generated for Eq. (22) by a suitable control of the two-port 38. The required second equation is now provided not by connecting another standard to the measurement ports, but by switching the three-port 51 into a second state. In this way sufficient information for the determination of the weighting factor is available, so that the complex measuring capability can be achieved without a single standard.

If reflectometers of the type shown in FIG. 9 are set up in the same way, a further connection, besides the first arbitrary connection of the two measuring ports, which is different from the first connection, is required, which again must be unknown and not reciprocal.

From the above explanations, it will be seen that the method according to the invention differs in significant respects from the conventional practice associated with six-port devices which operate with output meters instead of mixers and are described, for example, in [4] and [12]. By means of the methods different to the invention the reconstruction of two different wave values, which are used as input data for Eqs. (60)-(62), is successful in all cases for each one of the reflectometers, so that it becomes possible to enter the complex system error correction immediately. In contrast thereto the conventional method only supplies one piece of complex-value information—see discussion above relating to Eq. (49) —so that such an entry is not possible, which has far-reaching consequences:

While the conventional method for measuring reciprocal measurement subjects is required to perform measurements under three different conditions [12], which are produced there by means of two switchable damping elements and a switchable phase shifter, with the method of the invention two states already suffice, which in this case are being generated by the three-port 51 which can be simply realized, for example, as a switch. With non-reciprocal measured subjects the advantage becomes even greater. No additional effort is required in connection with the method of the invention, however, with the conventional method three additional calibrating measurements must be performed which additionally assume reproducibility in switching elements, which is not necessary in the method of the invention.

Furthermore, the mixer detection, because of the linear conversion, has a dynamic range greater by several orders of magnitude than the quadratic output detection.

It should also be noted that there is no need to require reproducibility at the two-port 38.

Figure 11:
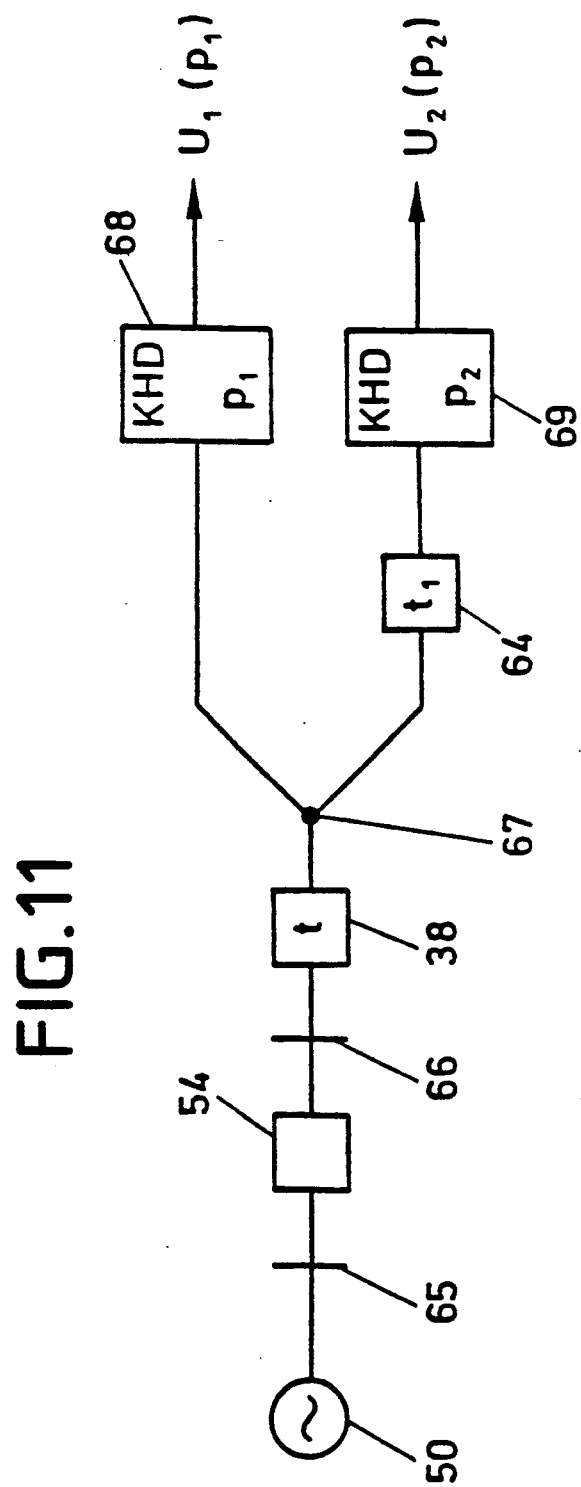
Figure 12:
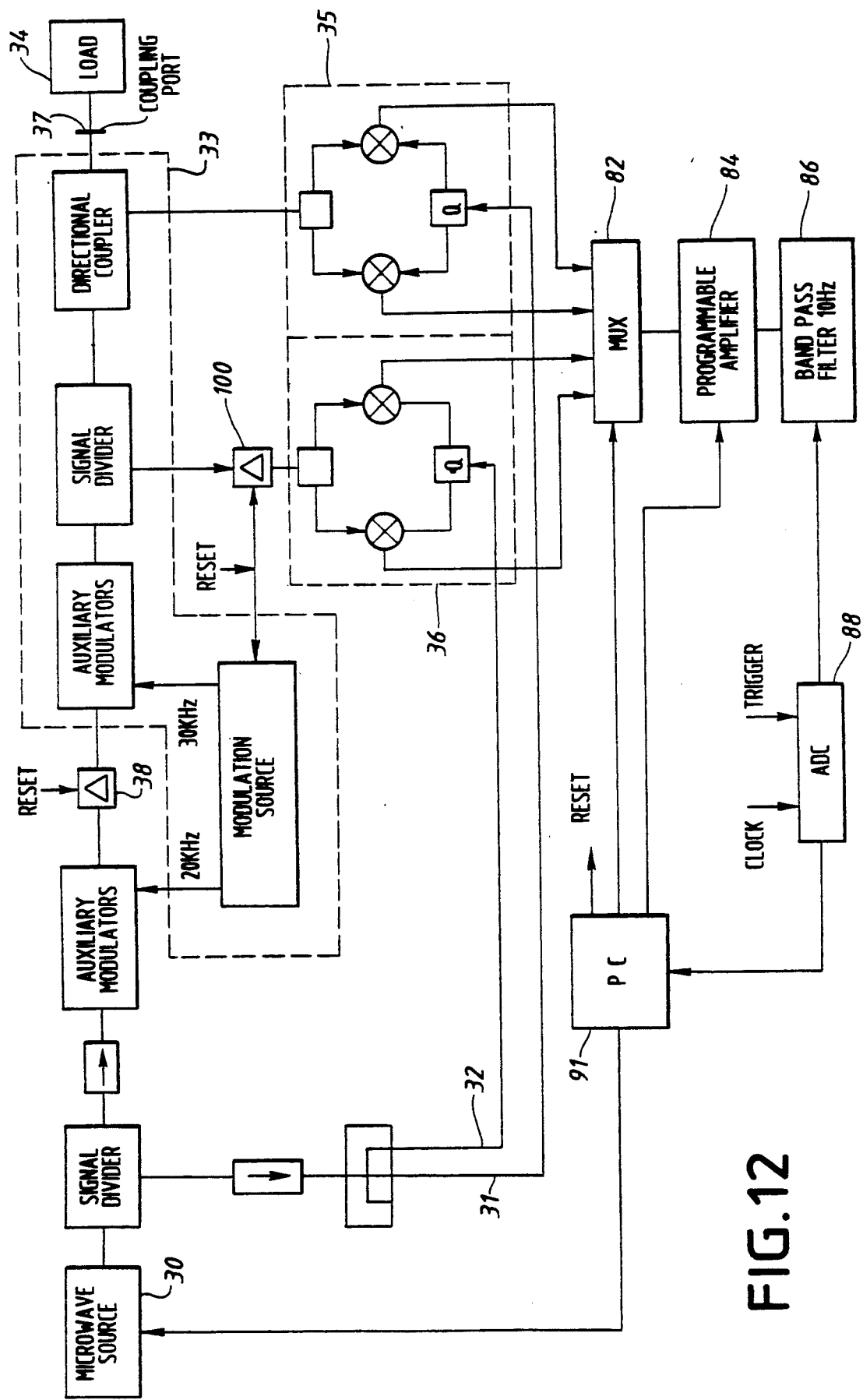

The transmission measuring device in accordance with FIG. 11 should be considered as a special case in connection with the devices so far described. The source 50 supplies, via the measurement object 54 and via the two-port 38, a branch point 67, to which a KHD 68 is directly connected and a further KHD 69 is connected via the two-port 64. The two-port 64 is of the type of the two-port 38, but need not have the same characteristics and may also be unknown as to its properties. The procedure for establishing the complex measuring capability is identical with that connected with equations (22)-(25), in this case the second equation not being produced by a second reflection, but by the second state of the two-port 64. The measuring ports 65 and 66 can be optionally connected. FIG. 12 presents a schematic diagram of a practical implementation of the embodiment of FIG. 8. Source 30 is a microwave source and Four Terminal device 33 includes a modulation source, an auxiliary modulator, a signal divider and a directional coupler. Two-port 38 is a first phase shifter and is connected to Source 30 via a signal divider, an isolator and another auxiliary modulator. Each KHD 35, 36 is composed of two mixers, a first signal divider connected to device 33 and a phase shifter connected to a respective one of lines 31 and 32. The four output voltages from KHDs are supplied to a multiplexer 82 and then, via a programmable amplifier 84, a band pass filter 86 and an analog-digital converter 88, to a data input of a computer, such as a personal computer, 91. Personal computer 91 is connected to control the operation of devices 82,84,33 and 38.

Furthermore, in this embodiment, a second two-port 100, here also in the form of a phase shifter, is connected between the device 33 and KHD 36.

In this arrangement, the clock and trigger signals for converter 88 may be supplied by the modulation source forming part of device 33.

In the modified arrangement shown in FIG. 12, the two-port device 101 must satisfy the same requirements as device 38. When device 100 is provided, the application of a second reflection device or standard to a measuring port 37 can be avoided. Thus, it is only necessary to connect just one reflection section standard, or test load, to measuring port 37. The electrical characteristics of this standard, or load, need not be known. By way of example, the load or reflection standard 34 could be a device producing a high degree of reflection, such as a short circuit termination.

Figure 13A:
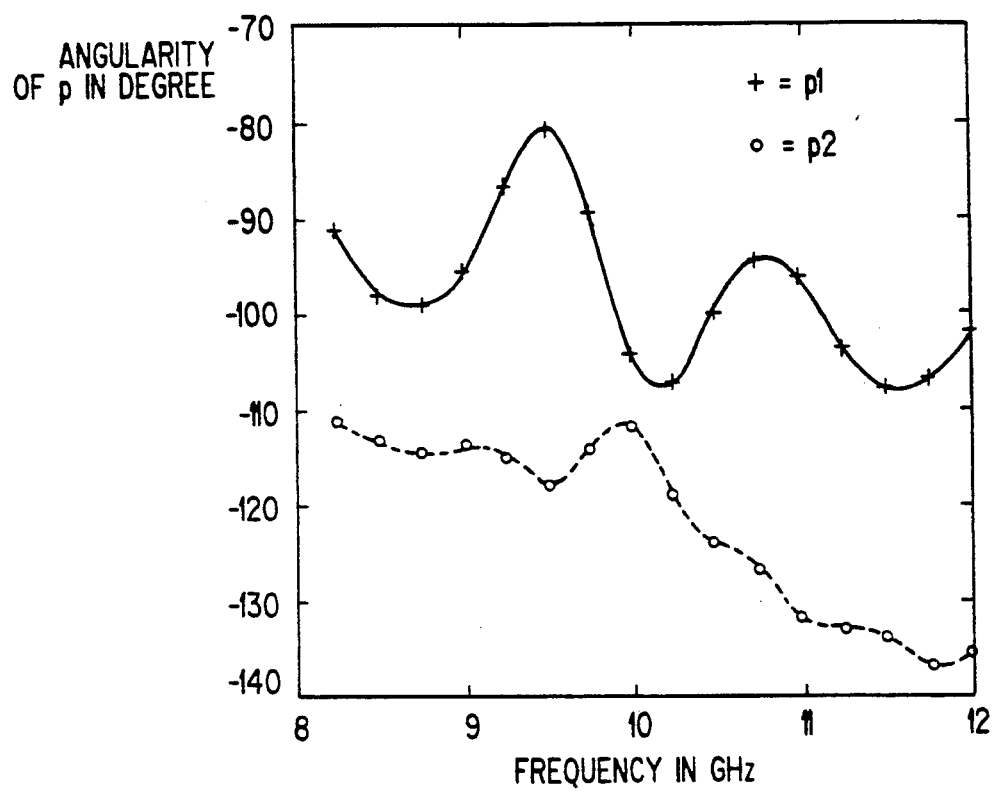
FIGS. 13a, and 13b, are diagrams illustrating exemplary weighting factors obtained when testing the circuit of FIG. 12.
Figure 13B:
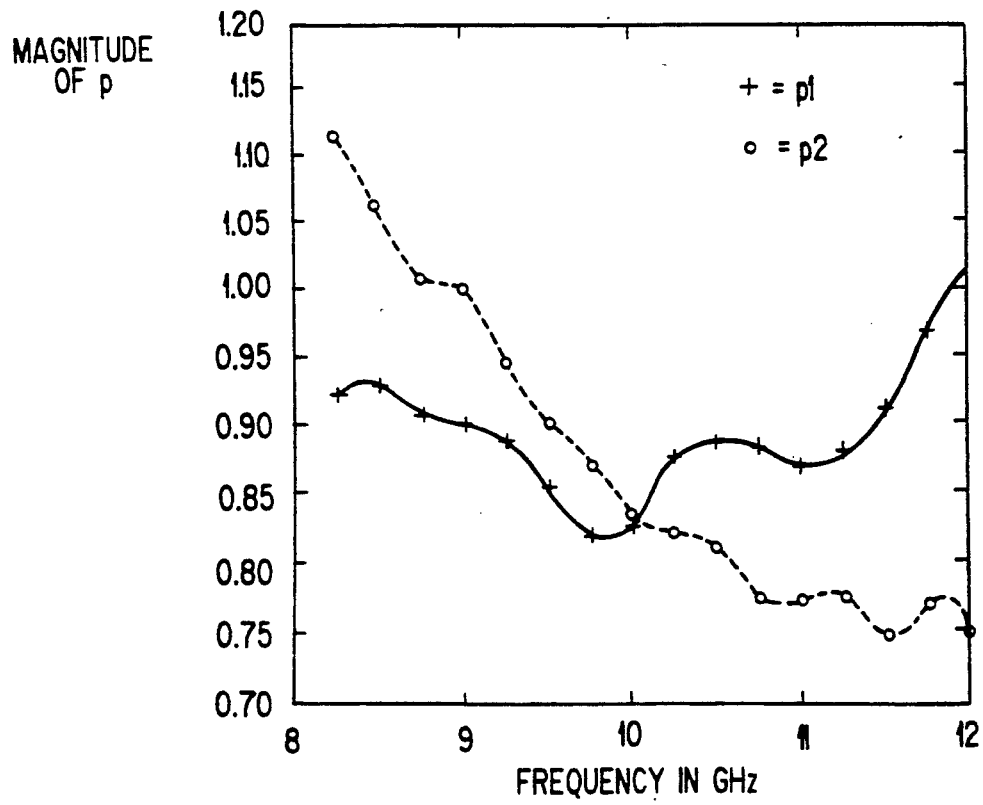

Typical examples of data obtained in methods according to the present invention are shown in FIGS. 13a and 13b. FIG. 13a depicts angular values, while FIG. 13b shows magnitude values for each of two values of p.

After the values shown in FIG. 13a and 13b have been derived, each value for p can be utilized to generate a complex voltage representation, according to equation (8). Then the ratio of the two complex voltages can be used to provide a pseudo-reflection factor $\Gamma$, i.e. according to equation (21), serving as $S_{11M}$ in reference <8>.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

REFERENCES

[1] KING, R. J., Microwave Homodyne Systems, Peter Peregrinus, 1978

[2] HEWLETT PACKARD, Applying the HP 8510B TRL Calibration for Non-coaxial Measurements, Product Note 8510-8, Oct. 1987

[3] FRANZEN, N. R., SPECIALE, R. A., A New Procedure for System Calibration and Error Removal in Automated S-Parameter Measurements, Proc. 5. EuMC, Hamburg, 1975, pp. 69–73.

[4] ENGEN, G. F., HOER, C. A., Thru-Reflect-Line: An Improved Technique for Calibrating the Dual Six Port Automatic Network Analyzer, IEEE MTT-27, Dec. 1979, pp. 987–993

[5] SCHIEK, B., Meßsysteme der Hochfrequenztechnik, Hüthig Verlag, Heidelberg 1984

[6] EUL, H. J., SCHIEK, B., Thru-Match-Reflect: One Result of a Rigorous Theory for De-embedding and Networkanalyzer Calibration, Proceedings of the 18th European Microwave Conference, Stockholm, 1988, pp. 909–914

[7] EUL, H. J., SCHIEK, B., Error-corrected Two-state Unidirectional Networkanalyzer, Electronics Letters, Vol. 24 No. 19, Sept. 1988, pp. 1197–1198

[8] HEWLETT PACKARD, Automating the HP 8410B Microwave Network Analyzer, Application Note 221A, June 1980

[9] GÄRTNER, U., SCHIEK, B., A Broad-Band Homodyne Network Analyzer with Binary Phase Modulation, IEEE MTT-34, Aug. 1986, pp. 902–906

[10] NEUMEYER, B., A Homodyne W-Band Networkanalyzer with Integrated Quadrature Detector, Proceedings of the 18th Europen Microwave Conference, Stockholm, 1988, pp. 333–338

[11] SCHWARZ, H. R., Numerische Mathematik, Teubner Verlag, Stuttgart, 1986

[12] HOER, C. A., A Network Anaylzer Incorporating Two Six-Port Reflectometers, IEEE-25, Dec. 1977, pp. 1070–1074

We claim:

1. A method for establishing the complex measuring capability of a homodyne operating network analysis device, comprising: connecting the device to a test circuit having a measuring port; connecting a first plurality of test loads, each having a respectively different electrical characteristic, in sequence to the measuring port; operating the device such that it produces first measuring signals while each test load is connected in turn to the measuring port; changing the electrical configuration of the test circuit and again operating the device such that it produces second measuring signals while each of a plurality of test loads is connected in turn to the measuring port; calculating the complex measuring capability of the device on the basis of the first and second measuring signals; and calibrating the device on the basis of the calculated complex measuring capability.

2. A method as defined in claim 1 wherein there are four test loads, and said step of changing the configuration of the test circuit comprises connecting at least one two-port component in circuit serves with the device and the measuring port.

3. A method as defined in claim 2 wherein the two-port component provides a through connection for measuring signals.

4. A method as defined in claim 2 wherein said step of connecting at least one two-port component comprises connecting two different two-port components, one at a time, in series with the device and the measuring port.

5. A method as defined in claim 2 wherein said step of connecting at least one two-port component comprises connecting three different two-port components one at a time, in series with the device and the measuring port.

6. A method as defined in claim 2 wherein the device is a reflectometer.

7. A method as defined in claim 6 wherein the two-port component provides a through connection for measuring signals.

8. A method as defined in claim 1 wherein said step of changing comprises providing a second plurality of test loads having electrical characteristics different from the first plurality of test loads 9. A method as defined in claim 8 wherein the two-port component provides a through connection for measuring signals.

10. A method as defined in claim 1 wherein the device is a reflectometer, the test circuit includes a two-port component which is switchable between two operating states in the test circuit, and said step of changing comprises switching the component between its two states.

11. A method as defined in claim 1 wherein the device is a double reflectometer.

12. A method for establishing the complex measuring capability of a six-port network device four ports of which are equipped with homodyne operating linear mixers, comprising: connecting the device to a test circuit having a measuring port; connecting four test loads, each having a respectively different electrical characteristic, in sequence to the measuring port; operating the device such that it produces first measuring signals while each test load is connected in turn to the measuring port; changing the electrical configuration of the test circuit and again operating the device such that it produces second measuring signals while each of the four test loads is connected n turn to the measuring port; calculating the complex measuring capability of the device on the basis of the first and second measuring signals; and calibrating the device on the basis of the calculated complex measuring capability.

13. A method as defined in claim 12 wherein the device is a double reflectometer.

* * * * *